United States Patent
Matsumura et al.

(10) Patent No.: US 7,780,811 B2
(45) Date of Patent: Aug. 24, 2010

(54) DICING DIE-BONDING FILM, METHOD OF FIXING CHIPPED WORK AND SEMICONDUCTOR DEVICE

(75) Inventors: Takeshi Matsumura, Osaka (JP); Masaki Mizutani, Osaka (JP); Sadahito Misumi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 620 days.

(21) Appl. No.: 11/671,982

(22) Filed: Feb. 6, 2007

(65) Prior Publication Data

US 2007/0137782 A1    Jun. 21, 2007

Related U.S. Application Data

(62) Division of application No. 10/849,414, filed on May 19, 2004, now Pat. No. 7,449,226.

(30) Foreign Application Priority Data

May 29, 2003    (JP)    ............................ 2003-152659

(51) Int. Cl.
*B29C 65/50*    (2006.01)
*B29C 65/52*    (2006.01)
*B29C 65/56*    (2006.01)
*B32B 37/04*    (2006.01)
*B32B 37/10*    (2006.01)
*B32B 37/12*    (2006.01)
*B32B 37/14*    (2006.01)
*B32B 37/26*    (2006.01)
*B32B 38/10*    (2006.01)
*B29C 65/02*    (2006.01)
*B32B 37/06*    (2006.01)
*B32B 37/18*    (2006.01)
*B32B 37/28*    (2006.01)

(52) U.S. Cl. ........................ 156/265; 156/250; 156/256; 156/261; 156/289

(58) Field of Classification Search ................. 156/250, 156/256, 261, 265, 289
See application file for complete search history.

(56) References Cited

U.S. PATENT DOCUMENTS 4,664,739 A    5/1987    Aurichio (Continued)

FOREIGN PATENT DOCUMENTS

EP    0 150 882 A1    8/1985

(Continued)

OTHER PUBLICATIONS

File History of the related U.S. Appl. No. 11/082,112, for the period of Aug. 20, 2008-Jan. 27, 2009.

(Continued)

*Primary Examiner*—Philip C Tucker
*Assistant Examiner*—Sonya Mazumdar
(74) *Attorney, Agent, or Firm*—Knobbe Martens Olson & Bear LLP

(57) ABSTRACT

The dicing die-bonding film of this invention comprises a pressure-sensitive adhesive layer (2) on a supporting base material (1) and a die-bonding adhesive layer (3) on the pressure-sensitive adhesive layer (2), wherein a releasability in an interface between the pressure-sensitive adhesive layer (2) and the die-bonding adhesive layer (3) is different between an interface (A) corresponding to a work-attaching region (3a) in the die-bonding adhesive layer (3) and an interface (B) corresponding to a part or the whole of the other region (3b), and the releasability of the interface (A) is higher than the releasability of the interface (B). According to this invention, there can be provided a dicing die-bonding film excellent in balance between retention in dicing a work and releasability in releasing its diced chipped work together with the die-bonding adhesive layer.

7 Claims, 1 Drawing Sheet

U.S. PATENT DOCUMENTS

| | | | |
|---|---|---|---|
| 4,687,693 | A | 8/1987 | Sheyon et al. |
| 4,701,236 | A * | 10/1987 | Vieilledent .................. 156/252 |
| 4,961,804 | A | 10/1990 | Aurichio |
| 5,098,501 | A | 3/1992 | Nishiguchi |
| 5,304,418 | A | 4/1994 | Akada et al. |
| 5,476,565 | A | 12/1995 | Akada et al. |
| 5,525,422 | A | 6/1996 | Spies et al. |
| 5,705,016 | A * | 1/1998 | Senoo et al. ................. 156/289 |
| 5,728,247 | A * | 3/1998 | Bustrich et al. ............. 156/256 |
| 5,844,348 | A | 12/1998 | Gamo |
| 5,882,956 | A * | 3/1999 | Umehara et al. ............ 438/114 |
| 5,888,606 | A * | 3/1999 | Senoo et al. ............... 428/66.6 |
| 6,007,920 | A * | 12/1999 | Umehara et al. ......... 428/473.5 |
| 6,140,151 | A | 10/2000 | Akram |
| 6,171,163 | B1 | 1/2001 | Seko et al. |
| 6,245,593 | B1 | 6/2001 | Yoshihar et al. |
| 6,258,426 | B1 | 7/2001 | Yamamoto et al. |
| 6,398,892 | B1 | 6/2002 | Noguchi et al. |
| 6,457,220 | B1 | 10/2002 | Hamano |
| 6,528,330 | B2 | 3/2003 | Iketani |
| 6,548,327 | B2 | 4/2003 | De Pauw et al. |
| 6,702,910 | B2 * | 3/2004 | Noguchi et al. ............... 156/85 |
| 6,938,783 | B2 | 9/2005 | Chung |
| 6,977,024 | B2 | 12/2005 | Yamazaki et al. |
| 7,054,161 | B1 | 5/2006 | James |
| 7,060,339 | B2 | 6/2006 | Matsumura et al. |
| 7,135,224 | B2 | 11/2006 | Sumi et al. |
| 7,147,920 | B2 | 12/2006 | Shiobara et al. |
| 7,223,319 | B2 * | 5/2007 | Kurosawa et al. ........... 156/344 |
| D549,189 | S | 8/2007 | Misumi et al. |
| 7,309,925 | B2 | 12/2007 | Matsumura et al. |
| 7,429,522 | B2 | 9/2008 | Matsumura et al. |
| 7,430,950 | B2 * | 10/2008 | Yamamoto ................... 83/490 |
| 7,449,226 | B2 | 11/2008 | Matsumura et al. |
| 7,452,752 | B2 | 11/2008 | Noda et al. |
| 7,508,081 | B2 | 3/2009 | Matsumura et al. |
| 2002/0001670 | A1 | 1/2002 | Pauw et al. |
| 2002/0014465 | A1 | 2/2002 | Chung |
| 2002/0042189 | A1 | 4/2002 | Tanaka |
| 2003/0207479 | A1 | 11/2003 | Border et al. |
| 2003/0226640 | A1 | 12/2003 | Yamazaki et al. |
| 2004/0023043 | A1 | 2/2004 | Ishikawa et al. |
| 2004/0105990 | A1 | 6/2004 | Shiobara et al. |
| 2004/0230000 | A1 | 11/2004 | Misumi et al. |
| 2004/0232563 | A1 | 11/2004 | Sumi et al. |
| 2004/0241910 | A1 | 12/2004 | Matsumura et al. |
| 2005/0046042 | A1 | 3/2005 | Matsumura et al. |
| 2005/0139973 | A1 | 6/2005 | Matsumura et al. |
| 2005/0208736 | A1 | 9/2005 | Matsumura et al. |
| 2005/0224978 | A1 | 10/2005 | Kawate et al. |
| 2005/0227064 | A1 | 10/2005 | Jin |
| 2006/0029762 | A1 | 2/2006 | Chung |
| 2006/0148131 | A1 | 7/2006 | Matsumura et al. |
| 2006/0252234 | A1 | 11/2006 | Saiki |
| 2006/0257651 | A1 | 11/2006 | Shintani |
| 2007/0003758 | A1 | 1/2007 | Jin |
| 2007/0077685 | A1 | 4/2007 | Noda et al. |
| 2007/0090299 | A1 | 4/2007 | Kozakai et al. |
| 2007/0104972 | A1 | 5/2007 | Shinohara et al. |
| 2007/0120271 | A1 | 5/2007 | Kozakai et al. |
| 2007/0218299 | A1 | 9/2007 | Azechi |
| 2008/0088036 | A1 | 4/2008 | Matsumura et al. |
| 2008/0090085 | A1 | 4/2008 | Kawate et al. |
| 2008/0108721 | A1 | 5/2008 | Ha et al. |
| 2009/0149003 | A1 | 6/2009 | Matsumura et al. |

FOREIGN PATENT DOCUMENTS

| | | |
|---|---|---|
| EP | 0 134 606 B1 | 3/1989 |
| EP | 0 550 014 A2 | 7/1993 |
| EP | 0 571 649 A1 | 12/1993 |
| EP | 0 588 180 A1 | 3/1994 |
| EP | 0 786 802 A2 | 7/1997 |
| EP | 0 792 756 A2 | 9/1997 |
| EP | 0 884 766 A2 | 12/1998 |
| EP | 0 976 802 A1 | 2/2000 |
| EP | 1 411 547 A2 | 4/2004 |
| EP | 1 482 546 A2 | 12/2004 |
| EP | 1 583 144 A2 | 10/2005 |
| GB | 2 340 772 A | 3/2000 |
| JP | 60-57642 | 4/1985 |
| JP | 60-196956 | 10/1985 |
| JP | 61-263136 | 11/1986 |
| JP | 62-79649 | 4/1987 |
| JP | 1-268131 | 10/1989 |
| JP | 2-248064 | 10/1990 |
| JP | 2-265258 | 10/1990 |
| JP | 4-042555 | 2/1992 |
| JP | 5-78629 A | 3/1993 |
| JP | 7-263382 | 10/1995 |
| JP | 8-213349 | 8/1996 |
| JP | 10-335271 | 12/1998 |
| JP | 11-111162 | 4/1999 |
| JP | 2002-158276 | 5/2002 |
| JP | 2002-226800 A | 8/2002 |
| JP | 2002-235055 | 8/2002 |
| JP | 2003-007646 | 1/2003 |
| JP | 2003-119438 | 4/2003 |
| JP | 2003-206468 A | 7/2003 |
| JP | 2003-316031 A | 11/2003 |
| JP | 2004-063953 | 2/2004 |
| JP | 2004-134689 | 4/2004 |
| JP | 2004-186429 | 7/2004 |
| JP | 2003-56248 | 9/2004 |
| JP | 2004-349510 | 12/2004 |
| JP | 2005-005355 | 1/2005 |
| JP | 2005-159069 | 6/2005 |
| JP | 2005-268434 | 9/2005 |
| JP | 2006-012998 | 1/2006 |
| JP | 2006-128621 | 5/2006 |
| JP | 2007-035852 | 2/2007 |
| JP | 2007-123914 | 5/2007 |
| KR | 20040034479 | 4/2004 |

OTHER PUBLICATIONS

File History of the related U.S. Appl. No. 11/369,931, for the period of Aug. 20, 2008-Jan. 27, 2009.

File History of the related U.S. Appl. No. 29/225,424, for the period of Aug. 20, 2008-Jan. 27, 2009.

European Search Report issued on the corresponding European Patent Application No. 03023536, dated Aug. 9, 2004.

Notification of Reasons for Refusal issued on the corresponding Japanese Patent Application No. 2003-152659, dated Sep. 27, 2006.

Written Opinion of Austrian Patent Office issued on the corresponding Singapore Patent Application No. 200402611-8, dated Apr. 13, 2007.

Chinese Office Action issued on the related Chinese Patent Application No. 200410098297.6, dated Sep. 28, 2007.

European Search Report issued on the related European Patent Application No. 05005884.1, dated Jun. 23, 2006.

File History of the related U.S. Appl. No. 10/849,414, for the period of Dec. 1, 2007-Aug. 19, 2008.

File History of the related U.S. Appl. No. 11/082,112, for the period of Dec. 1, 2007-Aug. 19, 2008.

File History of the related U.S. Appl. No. 11/369,931, for the period of Dec. 1, 2007-Aug. 19, 2008.

File History of the related U.S. Appl. No. 11/947,727, for the period of Dec. 1, 2007-Aug. 19, 2008.

File History of the related U.S. Appl. No. 29/225,424, for the period of Dec. 1, 2007-Aug. 19, 2008.

Japanese Office Action issued on the related Japanese Patent Application No. 2003-431690, dated Oct. 30, 2007.

Decision of Refusal issued on the corresponding Japanese Patent Application No. 2003-152659, dated Oct. 30, 2007.
European Search Report issued on the related European Patent Application No. EP03023536, dated Jul. 27, 2004.
European Search Report issued on the related European Patent Application No. EP04012260, dated Jan. 4, 2005.
European Search Report issued on the related European Patent Application No. 05 00 5884, dated Jun. 14, 2006.
File History of the related U.S. Appl. No. 11/082,112, as of Nov. 30, 2007.
File History of the related U.S. Appl. No. 11/369,931, as of Nov. 30, 2007.
File History of the related U.S. Appl. No. 11/947,727, as of Nov. 30, 2007.
File History of the related U.S. Appl. No. 29/225,424, as of Nov. 30, 2007.
Japanese Office Action issued on the related Japanese Patent Application No. 2003-431690, dated Jun. 26, 2007.
Japanese Patent Office Action issued on the related Japanese Patent Application No. 2003-431690, dated Jan. 18, 2007.
File History of the related U.S. Appl. No. 10/849,414, as of Nov. 30, 2007.
File History of the related U.S. Appl. No. 11/369,931, for the period of Jan. 28, 2009-Aug. 28, 2009.
File History of the related U.S. Appl. No. 29/225,424, for the period of Jan. 28, 2009-Aug. 28, 2009.
File History of the related U.S. Appl. No. 12/370,049, as of Aug. 28, 2009.
File History of the related U.S. Appl. No. 12/440,495, as of Aug. 28, 2009.
File History of the related U.S. Appl. No. 11/082,112, as of Feb. 26, 2008.
File History of the related U.S. Appl. No. 11/369,931, as of Feb. 26, 2008.
File History of the related U.S. Appl. No. 11/671,982, as of Feb. 26, 2008.
File History of the related U.S. Appl. No. 11/947,727, as of Feb. 26, 2008.
File History of the related U.S. Appl. No. 29/225,424, as of Feb. 26, 2008.
Written Opinion issued by the Austrian Patent Office on the corresponding Singapore Patent Application No. 200402611-8, dated Apr. 13, 2007.

* cited by examiner

DICING DIE-BONDING FILM, METHOD OF FIXING CHIPPED WORK AND SEMICONDUCTOR DEVICE

This is a divisional of U.S. patent application Ser. No. 10/849,414, filed May 19, 2004, which claims priority to Japanese Patent Application No. 2003-152659, field May 29, 2003, the disclosure of which is incorporated herein by reference in its entirety.

BACKGROUND OF THE INVENTION

1. Field of the Invention

The present invention relates to a dicing die-bonding film. The dicing die-bonding film is used for subjecting a work to dicing in such a state that an adhesive for sticking a chipped work (semiconductor chip etc.) to an electrode material is arranged on a work (semiconductor wafer etc.) before dicing. Further, this invention relates to a method of fixing a chipped work by using the dicing die-bonding film. Also, this invention relates to a semiconductor device having a chipped work adhesive-bonded by the fixing method.

2. Description of the Related Art

A semiconductor wafer on which a circuit pattern was formed is subjected to dice into chipped works (dicing step), as necessary after back-grinding to regulate the thickness. In the dicing step, the semiconductor wafer is generally washed at suitable fluid pressure (usually, about 2 kg/cm$^2$) to remove a cut layer. Then, the chipped work is adhesive-bonded onto an adherend such as a lead frame (mounting step), and then processed in a bonding step. In the mounting step, an adhesive is conventionally applied onto the lead frame or the chipped work. In this method, however, a uniform adhesive layer is hardly formed, and application of the adhesive requires a special unit and a long time. Accordingly, a dicing die-bonding film having an adhesive layer adhering semiconductor wafer thereto in the dicing step and providing a chip-mounting necessary for the mounting step has been proposed (see e.g. in JP-A 60-57642).

The dicing die-bonding film described in JP-A 60-57642 supra comprises an adhesive layer arranged in a releasable manner on a supporting base material. That is, a semiconductor wafer retained on an adhesive layer is diced, and the supporting base material is stretched to remove each chipped work together with the adhesive layer, and each work is recovered and fixed via the adhesive layer to an adherend such as a lead frame.

To prevent problems such as dicing inability and dimensional mistakes, the adhesive layer of this dicing die-bonding film is desired to have an ability to sufficiently maintain the semiconductor wafer and an ability to sufficiently release the chipped work together with the adhesive layer from the supporting base material after dicing. However, it is not easy to balance both the abilities. When sufficient retention is required of the adhesive layer particularly in a system of dicing a semiconductor wafer with a rotating circular tooth, the dicing die-bonding film satisfying the above characteristics is hardly obtained.

To overcome the problem, various improved methods are proposed (see e.g. on JP-A 2-248064). JP-A 2-248064 supra proposes a method which comprises allowing a UV-curing pressure-sensitive adhesive layer to be present between the supporting base material and the adhesive layer, then curing it by UV rays after dicing to lower the adhesion between the pressure-sensitive adhesive layer and the adhesive layer thereby releasing the layers from each other to facilitate pickup of the chipped work.

The die-bonding adhesive layer of this kind of dicing die-bonding film is arranged on the whole area of the pressure-sensitive adhesive layer (pressure-sensitive adhesive film) in many cases because of limitations on the production process. In this case, however, a dicing ring is bonded to the die-bonding adhesive layer, and thus the dicing ring is polluted in some cases. On one hand, there is also known a method wherein the die-bonding adhesive layer whose shape is adapted to the shape of a work so as to be the same as that of the work is formed on the pressure-sensitive adhesive layer. In this case, however, chip scattering may occur during dicing.

SUMMARY OF THE INVENTION

The object of this invention is to provide a dicing die-bonding film comprising a pressure-sensitive adhesive layer on a supporting base material and a die-bonding adhesive layer arranged in a releasable manner on the pressure-sensitive adhesive layer, which can prevent pollution of a dicing ring and can simultaneously prevent chip scattering during dicing.

Another object of this invention is to provide a method of fixing a chipped work by using the dicing die-bonding film. A still other object of this invention is to provide a semiconductor device comprising a chipped work adhesive-bonded by the fixing method.

The present inventors made extensive study to solve the problem, and as a result, they found a dicing die-bonding as described below, thus arriving at this invention.

That is, this invention relates to a dicing die-bonding film comprising a pressure-sensitive adhesive layer (2) on a supporting base material (1) and a die-bonding adhesive layer (3) on the pressure-sensitive adhesive layer (2), wherein the die-bonding adhesive layer (3) is arranged as a work-attaching region (3a) on a part of the pressure-sensitive adhesive layer (2), the work-attaching region (3a) can attach the whole area of the face of a work to be attached, and is larger than the area of the work face, and the work-attaching region (3a) is designed so as to be held within the inner diameter of a dicing ring stuck on the pressure-sensitive adhesive layer (2).

In the invention described above, the die-bonding adhesive layer (3) serving as the work-attaching region (3a) on a part of the pressure-sensitive adhesive layer (2) is designed so as to be held within the inner diameter of a dicing ring. Accordingly, the dicing ring can be arranged on the pressure-sensitive adhesive layer (2) around the work-attaching region (3a), and can be prevented from being polluted with the die-bonding adhesive layer (3). The dicing ring can be easily recovered without pollution on the pressure-sensitive adhesive layer and can be repeatedly used to improve reworking.

On one hand, the work-attaching region (3a) can attach the whole area of the face of a work to be attached, and is designed to be larger than the area of the work face. The reason for this design of the work-attaching region (3a) is that it was found that when the size of the work-attaching region (3a) is equal to or smaller than the work face, chip scattering occurs during dicing because of the high releasability of the die-bonding adhesive layer (3) from the pressure-sensitive adhesive layer (2). That is, chip scattering can be prevented during dicing by making the size of the work-attaching region (3a) larger than the attached work face as designed in this invention. The work-attaching region (3a) is designed to be held within the inner diameter of a dicing ring so as not to contact with the dicing ring.

In the dicing die-bonding film described above, preferably the adhesion of the pressure-sensitive adhesive layer (2) is different between a region (2a) corresponding to the work-attaching region (3a) and the other region (2b), and satisfies the following relationship:

the adhesion of the pressure-sensitive adhesive layer (2a) is lower than the adhesion of the pressure-sensitive adhesive layer (2b).

The pressure-sensitive adhesive layer (2a) can be designed to be easily releasable by designing the pressure-sensitive adhesive layer (2) such that the adhesion of the region (2a) corresponding to the work-attaching region (3a) and the adhesion of the other region (2b) satisfies the relationship: the adhesion of the pressure-sensitive adhesive layer (2a) is lower than the adhesion of the pressure-sensitive adhesive layer (2b). On one hand, a wafer ring can be bonded to the pressure-sensitive adhesive layer (2b), and can be fixed thereto so as not to be released during dicing or expansion. Accordingly, a dicing die-bonding film capable of easy release and pickup of a large chip of 10 mm×10 mm or more obtained as diced chipped work without inferior dicing can be obtained. Thus, the dicing die-bonding film can well balance retention during dicing step and releasability during pickup step.

In the dicing die-bonding film, the pressure-sensitive adhesive layer (2) can be formed from a radiation-curing pressure-sensitive adhesive, and the pressure-sensitive adhesive layer (2a) corresponding to the work-attaching region (3a) can be formed by irradiating it with radiations.

The die-bonding adhesive layer (3) is formed preferably from a thermosetting die adhesive. The die-bonding adhesive layer (3) is preferably not electroconductive.

Further, this invention relates to a method of fixing a chipped work, comprising the steps of:

pressing a work onto a die-bonding adhesive layer (3a) in the dicing die-bonding film, pressing a dicing ring onto a pressure-sensitive adhesive layer (2), dicing the work into chips, releasing the chipped work together with the die-bonding adhesive layer (3a) from the pressure-sensitive adhesive layer (2), and fixing the chipped work to a semiconductor element via the die-bonding adhesive layer (3a).

Further, the present invention relates to a semiconductor device comprising a chipped work fixed onto a semiconductor element via the die-bonding adhesive (3a) by the method of fixing a chipped work to a substrate or a chip.

DETAILED DESCRIPTION OF THE INVENTION

Figure 1:
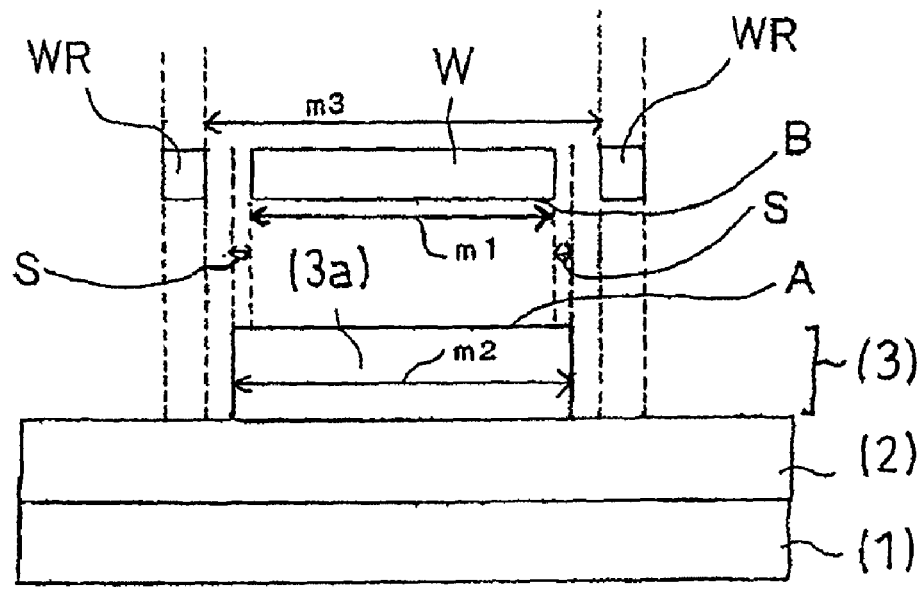
FIG. 1 is an example of a sectional view of the dicing die-bonding film (1) of the present invention.
Figure 2:
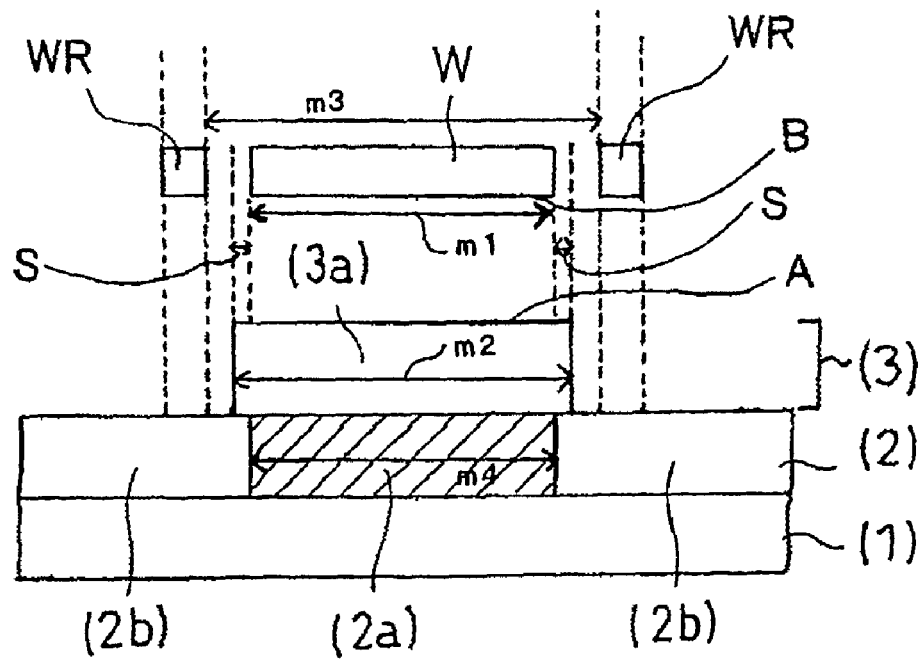
FIG. 2 is an example of a sectional view of the other dicing die-bonding film (1) of the present invention.

Hereinafter, the dicing die-bonding film of the present invention is described by reference to the drawings. FIGS. 1 and 2 are sectional views of the dicing die-bonding films of this Invention, both of which comprise a pressure-sensitive adhesive layer (2) on a supporting base material (1) and a work (W)-attaching region (3a) as a die-bonding adhesive layer (3) on a part of the pressure-sensitive adhesive layer (2).

The surface (A) of the work-attaching region (3a) can attach the whole area of a work face (B) to be attached, and is designed to be larger than the area of the work face. Preferably the work-attaching region (3a) is usually designed so as to have a shape similar to and larger than the work face. The work-attaching region (3a) is designed so as to be held in a frame determined by the inner diameter of a dicing ring (WR). The dicing ring (WR) used has a size predetermined depending on the size of work (W).

For example, when the face of work (W) is circular with diameter (m1), the work-attaching region (3a) is designed to be circular with diameter (m2) satisfying the relationship m2>m1. The width difference (m2−m1) is suitably determined depending on the size of the work face (B), and when the diameter of the work face is 1 to 12 inches (about 300 mm), the width difference is preferably designed to be usually 0.1 mm or more, particularly 0.5 mm or more. In relationship with the inner diameter (m3) of the dicing ring (WR), the work-attaching region (3a) is designed to satisfy the relationship m3>m2. The difference (m3−m2) is not particularly limited, but is preferably 5 mm or more, more preferably 10 mm or more. When the work (W) is attached to the work-attaching region (3a), the outer periphery width difference(s) between the whole outer periphery of the work-attaching region (3a) and the whole outer periphery of the work face is preferably nearly uniform along the whole outer periphery. That is, the work is preferably attached such that the outer periphery width difference $(s) \approx (m2-m1)/2$.

FIG. 2 shows an example wherein in the adhesive layer (2), the adhesion of the part (2a) corresponding to the work (W)-attaching region (3a) and the adhesion of the other region (2b) are regulated so as to satisfy that the adhesion of the pressure-sensitive adhesive layer (2a) is lower than the adhesion of the pressure-sensitive adhesive layer (2b).

As the method of regulating the adhesion of the pressure-sensitive adhesive layer (2) as shown in FIG. 2, mention is made of, for example, a method wherein the pressure-sensitive adhesive layer (2) is formed from a radiation-curing pressure-sensitive adhesive, and the region (2a) corresponding to the work (W)-attaching region (3a) is irradiated with radiations. In this case, the pressure-sensitive adhesive layer (2b) not irradiated with radiations has higher adhesion than that of the pressure-sensitive adhesive layer (2a). When a wafer ring is applied to the pressure-sensitive adhesive layer (2b), the wafer ring is adhesive-fixed at the time of dicing etc., and after dicing, the wafer ring can be easily released by irradiation with radiations.

FIG. 2 shows an example wherein the pressure-sensitive adhesive layer (2a) is established to have the same size as that of work (W), whereupon the diameter (m4) of the pressure-sensitive adhesive layer (2a) is the same as the diameter (m1) of the work (W). In this case, the work-sticking region (3a) can be fixed in the region of the width difference (m2−m4) so as not to release the pressure-sensitive adhesive layer (2b) during dicing etc. The diameter (m4) of the pressure-sensitive adhesive layer (2a) is regulated preferably in the range of $m3 \geq m4 \geq m1$.

The supporting base material (1) serves as a material conferring strength on the dicing die-bonding film. Examples thereof include polyolefins such as low-density polyethylene, linear polyethylene, medium-density polyethylene, high-density polyethylene, super-low-density polyethylene, a random copolymer of polypropylene, a block copolymer of polypropylene, homopolypropylene, polybutene and polymethyl pentene; an ethylene-vinyl acetate copolymer, ionomer resin, an ethylene/(meth)acrylic acid copolymer, an ethylene/(meth)acrylate (random, alternating) copolymer, an ethylene-butene copolymer, an ethylene-hexene copolymer, polyurethane, polyesters such as polyethylene terephthalate and polyethylene naphthalene, polycarbonate, polyimide, polyether ether ketone, polyimide, polyether imide, polyamide, aromatic polyamide, polyphenyl sulfide, aramid (paper), glass, glass cloth, fluorine resin, polyvinyl chloride, polyvinylidene chloride, cellulose resin, silicone resin, metal (foil), paper etc.

The material of the supporting base material includes polymers such as crosslinked resin. The plastic film may be non-stretched or may be subjected to uniaxial or biaxial stretching treatment if necessary. The resin sheet endowed with thermal shrinkage by stretching treatment can thermally shrink the supporting base material after dicing, whereby the contact area between the pressure-sensitive adhesive layer (2a) and the adhesive layer (3a) is reduced to facilitate recovery of the chipped work.

The surface of the supporting base material can be subjected to ordinary surface treatment for improving adhesion and maintenance of the adjacent layer, for example chemical or physical treatment such as treatment with chromate, exposure to ozone, exposure to flames, high-voltage electric shock exposure, and treatment with ionization radiations, or coating treatment with a undercoat (for example, a sticky material described later).

The material of the supporting base material may be the same material or a suitable mixture of different materials, and if necessary a blend of several materials can also be used. Further, the supporting base material may be provided thereon with an electroconductive deposit of 30 to 500 Å in thickness composed of a metal, an alloy or oxide thereof in order to confer antistatic performance. The supporting base material may be composed of a single or two or more layers. When the pressure-sensitive adhesive layer (2) is radiation-curing type, a supporting base material partially transmitting radiations such as X rays, UV rays and electron rays is used.

The thickness of the supporting base material (1) can be suitably determined without particular limitation, but is generally about 5 to 200 μm.

The pressure-sensitive adhesive used in formation of the pressure-sensitive adhesive layer (2) is not particularly limited insofar as it can regulate the die-bonding adhesive layer (3a) in a releasable manner. For example, use can be made of general pressure-sensitive adhesives such as an acrylic pressure-sensitive adhesive and a rubber pressure-sensitive adhesive. From the viewpoint of cleaning and detergency for pollutant-free electronic parts such as semiconductor wafers and glass with ultra-pure water or an organic solvent such as alcohol, the pressure-sensitive adhesive is preferably an acrylic pressure-sensitive adhesive based on an acrylic polymer.

The acrylic polymer is, for example, an acrylic polymer using one or more monomer components selected from alkyl (meth)acrylates (for example, $C_{1-30}$ alkyl, particularly $C_{4-18}$ linear or branched alkyl esters such as methyl ester, ethyl ester, propyl ester, isopropyl ester, butyl ester, isobutyl ester, s-butyl ester, t-butyl ester, pentyl ester, isopentyl ester, hexyl ester, heptyl ester, octyl ester, 2-ethyl hexyl ester, isooctyl ester, nonyl ester, decyl ester, isodecyl ester, undecyl ester, dodecyl ester, tridecyl ester, tetradecyl ester, hexadecyl ester, octadecyl ester, eicosyl ester etc.) and cycloalkyl(meth)acrylates (for example, cyclopentyl ester, cyclohexyl ester etc.). The (meth)acrylates refer to acrylates and/or methacrylates, and in this meaning, (meth) is used throughout in this invention.

For the purpose of improving cohesiveness and heat resistance, the acrylic polymer may contain units corresponding to other monomer components copolymerizable with the above (meth)acrylates and cycloalkyl esters. Such monomer components include, for example, carboxyl group-containing monomers such as acrylic acid, methacrylic acid, carboxyethyl (meth)acrylate, carboxypentyl(meth)acrylate, itaconic acid, maleic acid, fumaric acid and crotonic acid; acid anhydride monomers such as maleic anhydride and itaconic anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate and (4-hydroxymethylcyclohexyl)methyl (meth)acrylate; sulfonic acid group-containing monomers such as styrenesulfonic acid, allylsulfonic acid, 2-(meth)acrylamide-2-methylpropanesulfonic acid, (meth)acrylamidopropanesulfonic acid and sulfopropyl (meth)acrylate, (meth)acryloyloxy naphthalene sulfonic acid; phosphate group-containing monomers such as 2-hydroxyethylacryloyl phosphate; and acrylamide, acrylonitrile etc. One or more of these copolymerizable monomer components can be used. The amount of these copolymerizable monomers is preferably 40% or less by weight based on the total monomer components.

If necessary, the acrylic polymers can contain multifunctional monomers to be crosslinked as copolymerizable monomer components. The multifunctional monomers include, for example, hexanediol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. One or more of these multifunctional monomers can be used. From the viewpoint of adhesion properties etc., the amount of the multifunctional monomers is preferably 30% or less by weight based on the total monomer components.

The acrylic polymer is obtained by subjecting a single monomer or a mixture of two or more monomers to polymerization. This polymerization can be carried out in any systems of solution polymerization, emulsion polymerization, bulk polymerization and suspension polymerization. From the viewpoint of preventing pollution of a clean adherend, the content of low-molecular substances in the acrylic polymer is preferably lower. In this respect, the number-average molecular weight of the acrylic polymer is preferably 300,000 or more, more preferably about 400,000 to 3,000,000.

The pressure-sensitive adhesive can suitably use an external crosslinking agent for increasing the number-average molecular weight of the acrylic polymer etc. as the base polymer.

A specific means of an external crosslinking method includes a method of reacting monomers by adding a crosslinking agent such as polyisocyanate compound, epoxy compound and aziridine compound, melamine-based crosslinking agent. When the external crosslinking agent is used, the amount of the crosslinking agent used is suitably determined according to balancing with the base polymer to be crosslinked and the use of the pressure-sensitive adhesive. Generally, the external crosslinking agent is compounded in an amount of preferably 5 parts or less by weight, more preferably 0.1 to 5 parts by weight, based on 100 parts by weight of the base polymer. If necessary, the pressure-sensitive adhesive may include various kinds of conventional additives such as tackifier, antioxidants etc.

The pressure-sensitive adhesive layer (2) can be formed from a radiation-curing pressure-sensitive adhesive. The radiation-curing pressure-sensitive adhesive can easily lower the adhesion by increasing the degree of crosslinking upon irradiation with radiations such as UV rays, and the pressure-sensitive adhesive layer (2a) only can be irradiated with radiations to provide a difference in adhesion from the pressure-sensitive adhesive layer (2b).

Further, the radiation-curing pressure-sensitive adhesive layer (2) fitted with the work-attaching region (3a) can be cured to easily provide the pressure-sensitive adhesive layer (2a) with a significant reduction in adhesion. Because the adhesive layer (3a) is stuck on the pressure-sensitive adhesive layer (2a) whose adhesion was reduced by curing, the interface between the pressure-sensitive adhesive layer (2a) and the adhesive layer (3a) is inherently easily separated at the pickup step. On the other hand, the region not irradiated with radiations has sufficient adhesion, and forms the pressure-sensitive adhesive layer (2b).

In the dicing die-bonding film in FIG. 2, the pressure-sensitive adhesive layer (2b) made of the uncured radiation-curing pressure-sensitive adhesive can fix a wafer ring etc. as described above.

The radiation-curing pressure-sensitive adhesive can be used without particular limitation insofar as it has radiation-curing functional groups such as carbon-carbon double bonds and simultaneously shows adhesion. Examples of the radiation-curing pressure-sensitive adhesive include addition-type radiation-curing pressure-sensitive adhesives comprising a radiation-curing monomer component or oligomer component compounded with a general pressure-sensitive adhesive for example the above-mentioned acrylic pressure-sensitive adhesive or rubber pressure-sensitive adhesive.

The radiation-curing monomer components blended include, for example, urethane oligomers, urethane (meth) acrylate, trimethylol propane tri(meth)acrylate, tetramethylol methane tetra(meth)acrylate, pentaerythritol tri(meth)acrylate, pentaerythritol tetra(meth)acrylate, dipentaerythritol monohydroxypenta(meth)acrylate, dipentaerythritol hexa (meth)acrylate, 1,4-butanediol di(meth)acrylate etc. The radiation-curing oligomer components include various oligomers such as those based on urethane, polyether, polyester, polycarbonate and polybutene, and the molecular weight thereof is preferably in the range of about 100 to 30000. Depending on the type of the pressure-sensitive adhesive layer, the amount of the radiation-curing monomer components and oligomer components blended can be suitably determined so as to lower the adhesion of the pressure-sensitive adhesive layer. Generally, the amount thereof is for example 5 to 500 parts by weight, preferably 40 to 150 parts by weight, based on 100 parts by weight of the base polymer such as the acrylic polymer constituting the pressure-sensitive adhesive.

The radiation-curing pressure-sensitive adhesive includes not only the above-described addition-type radiation curing pressure-sensitive adhesives, but also internal-type radiation-curing pressure-sensitive adhesives using a base polymer having carbon-carbon double bonds in side chains or main chain of the polymer or at the end of the main chain. The internal-type radiation-curing pressure-sensitive adhesive is preferable because it does not requires incorporation of low-molecular components such as oligomer components or does not contain a large amount of oligomer components, thus enabling formation of a pressure-sensitive adhesive layer having a stable layer structure without movement with time of the oligomer components etc. in the pressure-sensitive adhesive.

The base polymer having carbon-carbon double bonds can be used without particular limitation insofar as it has carbon-carbon double bonds and simultaneously has adhesion. The base polymer preferably has an acrylic polymer as a fundamental skeleton. As the fundamental skeleton of the acrylic polymer, mention is made of the above-exemplified acrylic polymer.

The method of introducing carbon-carbon double bonds into the acrylic polymer is not particularly limited and various methods can be used, but it is easy in molecular design to introduce carbon-carbon double bonds into side chains of the polymer. For example, mention is made of a method in which a monomer having a functional group is copolymerized with the acrylic polymer, and then a compound having carbon-carbon double bonds and a functional group capable of reacting with the above functional group is subjected, while the radiation curing properties of the carbon-carbon double bonds are maintained, to condensation or addition reaction with the copolymer.

Combinations of these functional groups include, for example, a carboxylic acid group and an epoxy group, a carboxylic acid group and an aziridyl group, and a hydroxyl group and an isocyanate group. Among those combinations of functional groups, a combination of a hydroxyl group and an isocyanate group is preferable for easy monitoring of the reaction. Further, if a combination of such functional groups is a combination forming the acrylic polymer having carbon-carbon double bonds, the functional groups may be present in either the acrylic polymer or the above compound, and it is preferable in the above preferable combination that the acrylic polymer has a hydroxyl group, and the above compound has an isocyanate group. In this case, the isocyanate compound having carbon-carbon double bonds includes, for example, methacryloyl isocyanate, 2-methacryloyl oxyethyl isocyanate, m-isopropenyl-α,α-dimethylbenzyl isocyanate etc. As the acrylic polymer, use is made of a polymer prepared by copolymerizing the above-exemplified hydroxyl group-containing monomer or an ether compound such as 2-hydroxy ethyl vinyl ether, 4-hydroxy butyl vinyl ether or diethylene glycol monovinyl ether.

As the internal-type radiation-curing pressure-sensitive adhesive, the base polymer having carbon-carbon double bonds (particularly the acrylic polymer) can be singly used. The radiation-curing monomer components and oligomer components can also be compounded to such a degree that the characteristics are not deteriorated. The amount of the radiation-curing oligomer components is usually in the range of 0 to 30 parts by weight, preferably 0 to 10 parts by weight, based on 100 parts by weight of the base polymer.

For curing with UV rays etc., the radiation-curing pressure-sensitive adhesive is blended with a photopolymerization initiator. The photopolymerization initiator includes, for example, α-ketol compounds such as 4-(2-hydroxyethoxy) pheny(2-hydroxy-2-propyl)ketone, α-hydroxy-α,α'-dimethyl acetophenone, 2-methyl-2-hydroxypropiophenone and 1-hydroxycyclohexyl phenyl ketone; acetophenone compounds such as methoxy acetophenone, 2,2-dimethoxy-2-phenyl acetophenone, 2,2-diethoxy acetophenone and 2-methyl-1-[4-(methylthio)-phenyl]-2-morpholinopropane-1; benzoin ether compounds such as benzoin ethyl ether, benzoin isopropyl ether and anisoin methyl ether; ketal compounds such as benzyl dimethyl ketal; aromatic sulfonyl chloride compounds such as 2-naphthalene sulfonyl chloride; optically active oxime compounds such as 1-phenone-1,1-propanedione-2-(o-ethoxycarbonyl)oxime; benzophenone compounds such as benzophenone, benzoylbenzoic acid and 3,3'-dimethyl-4-methoxy benzophenone; thioxanthone compounds such as thioxanthone, 2-chlorothioxanthone, 2-methyl thioxanthone, 2,4-dimethyl thioxanthone, isopropyl thioxanthone, 2,4-dichlorothioxanthone, 2,4-diethyl thioxanthone and 2,4-diisopropyl thioxanthone; camphor quinone;

halogenated ketones; acyl phosphinoxides; and acyl phosphonates. The amount of the photopolymerization initiator blended is for example 0.05 to 20 parts by weight based on 100 parts by weight of the base polymer such as acrylic polymer constituting the pressure-sensitive adhesive.

The radiation-curing pressure-sensitive adhesive include pressure-sensitive adhesive disclosed in JP-A 60-196956, for example rubber-based pressure-sensitive adhesive and acrylic pressure-sensitive adhesive containing an addition-polymerizable compound having two or more unsaturated bonds or a photopolymerizable compound such as alkoxy silane having an epoxy group and a photopolymerizable initiator such as a carbonyl compound, organic sulfur compound, peroxide, amine, or onium salt-based compound.

If necessary, the radiation-curing pressure-sensitive adhesive layer (2) can also contain a compound to be colored by irradiation with radiations. By incorporating the compound colored by irradiation with radiations into the radiation-curing pressure-sensitive adhesive (2), only a region irradiated with radiations can be colored. That is, the pressure-sensitive adhesive layer (2a) corresponding to the work-attaching region (3a) can be colored. Accordingly, whether the pressure-sensitive adhesive layer (2) has been irradiated with radiations can be immediately judged with the naked eye, and the work-attaching region (3a) can be easily recognized to facilitate attachment to a work. Further, when the resulting semiconductor element is detected by an optical sensor etc., the detection accuracy is improved, thus preventing erroneous working in pickup of the semiconductor element.

The compounds to be colored by irradiation with radiations are colorless or light-colored before irradiation with radiations, but are colored by irradiation with radiations. Preferable examples of such compounds include leuco dyes. The leuco dyes used are preferably conventional dyes based on triphenyl methane, fluoran, phenothiazine, auramine and spiropyran. Specifically, mention is made of 3-[N-(p-tolylamino)]-7-anilinofluoran, 3-[N-(p-tolyl)-N-methylamino]-7-anilinofluoran, 3-[N-(p-tolyl)-N-ethylamino]-7-anilinofluoran, 3-diethylamino-6-methyl-7-anilinofluoran, crystal violet lactone, 4,4',4''-trisdimethylaminotriphenyl methanol, and 4,4',4''-trisdimethylaminotriphenyl methane, etc.

Developers used preferably with these leuco dyes include electron acceptors, for example conventionally used initial polymers of phenol-formalin resin, aromatic carboxylic acid derivatives, activated clay etc., and can be used in combination with various coloring agents for changing color tone.

The compound to be colored with irradiation with radiations may be first dissolved in an organic solvent etc. and then incorporated into the radiation-curing pressure-sensitive adhesive, or may be first pulverized finely and then incorporated into the pressure-sensitive adhesive. The ratio of this compound used is 10% or less by weight, preferably 0.01 to 10% by weight, more preferably 0.5 to 5% by weight, based on the pressure-sensitive adhesive layer (2). When the ratio of the compound is higher than 10% by weight, too much radiation applied to the pressure-sensitive adhesive layer (2) is adsorbed into this compound, and therefore the pressure-sensitive adhesive layer (2a) is hardly cured, thus failing to lower adhesion sufficiently. For sufficient coloration, on the other hand, the ratio of the compound is preferably 0.01% or more by weight.

When the pressure-sensitive adhesive layer (2) is formed from the radiation-curing pressure-sensitive adhesive, a part of the pressure-sensitive adhesive layer (2) is irradiated with radiations preferably such that the adhesion of the pressure-sensitive adhesive layer (2a) is lower than the adhesion of the pressure-sensitive adhesion layer (2b). In the dicing die-bonding film in FIG. 2, the adhesion of the pressure-sensitive adhesion layer (2a) to an SUS304 plate (#2000 polishing) as an adherend is lower than the adhesion of the pressure-sensitive adhesive layer (2b) to the plate.

As the method of forming the pressure-sensitive adhesive layer (2a), mention is made of a method wherein the radiation-curing pressure-sensitive adhesive layer (2) is formed on the supporting base material (1), and a region corresponding to the work-attaching region (3a) is cured by partial irradiation with radiations, to form the pressure-sensitive adhesive layer (2a). The partial irradiation with radiations can be carried out via a photomask having a pattern corresponding to the region (3b, etc.) other than the work-attaching region (3a). Mention is also made of a method of curing the pressure-sensitive adhesion layer by spot irradiation with UV rays. Formation of the radiation-curing pressure-sensitive adhesive layer (2) can be carried out by transferring the layer arranged on a separator to the supporting base material (1). The radiation-curing pressure-sensitive adhesive layer (2) arranged on the separator may be subjected to partial curing radiations.

Alternatively, when the pressure-sensitive adhesive layer (2) is formed from a radiation-curing pressure-sensitive adhesive, use can be made of a method wherein the supporting base material (1), at least one side of which is light-shielded except for the whole or a part of a region corresponding to the work-attaching region (3a), is provided with the radiation-curing pressure-sensitive adhesive layer (2) and then cured in the region corresponding to the work-attaching region (3a) to form the pressure-sensitive adhesive layer (2a) whose adhesion is lowered. Printing or depositing a material capable of serving as a photomask on the supporting film can produce the light-shielding material. According to such production method, the dicing die-bonding film of this invention can be efficiently produced.

When curing inhibition by oxygen occurs during irradiation with radiations, the surface of the radiation-curing pressure-sensitive adhesive layer (2) is preferably shielded from oxygen (air) by some methods. Such methods involve covering the surface of the pressure-sensitive adhesive layer (2) with a separator or irradiating with radiations such as UV rays etc. in a nitrogen atmosphere.

The thickness of the pressure-sensitive adhesive layer (2) is not particularly limited, but is preferably about 1 to 50 μm from the viewpoint of preventing the cut surface of a chip from being broken and simultaneously retaining the adhesive layer. The thickness is more preferably 2 to 30 μm, still more preferably 5 to 25 μm.

When a work (semiconductor wafer etc.) contact-bonded onto the die-bonding adhesive layer (3) is diced into chips, the adhesive layer (3) adheres to and supports the work, and when the chipped work formed into cut fragment (semiconductor chip etc.) is to be mounted, the adhesive layer works for fixing the chipped work to a semiconductor element (substrate, chip etc.). It is particularly important that the die-bonding adhesive layer (3) has such adhesion as not to scatter cut fragments during dicing of the work. In the dicing die-bonding film, the die-bonding adhesive layer (3) is arranged in the previously formed work-attaching region (3a).

The die-bonding adhesive layer (3) can be formed from a usual die adhesive. The die adhesive is preferably an adhesive that can be formed into a sheet. Preferable examples of the die adhesive include die adhesives made of thermoplastic or thermosetting resins. From the viewpoint that can make the temperature of the adhesive to the work low and heat resistance is excellent with curing, the pressure-sensitive adhesive is preferably the die adhesive made of the thermosetting resin. The die adhesives can be used alone or more in combination thereof. The die-bonding adhesive layer is preferably a layer that can stick to a work such as a semiconductor wafer or to a dicing ring at 70° C. or less. The die-bonding adhesive layer is more preferably a layer that can stick at ordinary temperatures.

The thermoplastic resin used as the die adhesive (thermoplastic die adhesive) includes, for example, saturated polyester resin, thermoplastic polyurethane-based resin, amide-based resin (nylon-based resin), imide-based resin etc. The thermosetting resin (thermosetting die adhesive) includes, for example, epoxy resin, unsaturated polyester-based resin, thermosetting acrylic resin, phenol resin etc. The thermosetting resin is preferably a thermosetting resin in B-stage, which was desolvated and formed into a sheet. A mixture in B-stage of the thermosetting resin and thermoplastic resin can also be used. In this invention, resins for examples those having a high glass transition temperature based on silicone, rubber, urethane, imide and acryl can also be used as the die adhesive.

The die-bonding adhesive layer (3) may have a two- or more multi-layer structure by suitably combining thermoplastic resins different in glass transition temperature or thermosetting resins different in thermosetting temperature. Because water for cutting is used in the step of dicing the work (semiconductor wafer etc.), the die-bonding adhesive layer (3) adsorbs moisture to attain a water content higher than in an ordinary state. When the adhesive layer (3) having such a high water content is allowed to adhere to a substrate etc., water vapor may be retained in the interface of the adhesive at the after-cure stage to cause lifting. Accordingly, the die-bonding adhesive is constituted such that a film highly adsorbing moisture is sandwiched between the die adhesives, whereby water vapor is diffused through the film at the after-cure stage, to overcome the problem. Accordingly, the die-bonding adhesive layer (3) may be composed of a multi-layer structure having an adhesive layer, a film and an adhesive layer laminated in this order.

Though not particularly limited, the thickness of the die-bonding adhesive layer (3) is for example about 5 to 100 μm, preferably about 10 to 50 μm.

The dicing die-bonding films (1) and (2) comprising the pressure-sensitive adhesive layer (2) on the supporting base material (1) and the die-bonding adhesive layer (3) on the pressure-sensitive adhesive layer (2) are obtained in this manner.

The dicing die-bonding film can be endowed with antistatic performance for the purpose of preventing generation of static electricity upon sticking or release, or breakage of circuits by works (semiconductor wafer etc.) electrified with such static electricity. Antistatic performance can be given in a suitable system, for example by adding an antistatic agent or an electroconductive material to the supporting base material (1), the pressure-sensitive adhesive layer (2) or the adhesive layer (3a) or by providing the supporting base material (1) with an electrostatic layer made of a charge-transferring complex or a metallic film. This system is preferably a system not generating contaminating ions that may denature semiconductor wafers. The electroconductive material (electroconductive filers) incorporated for the purpose of conferring electrical conductivity, thermal conductivity etc. includes spherical, needle or flaky metal powders of silver, aluminum, gold, copper, nickel, electroconductive alloys etc., metal oxides such as alumina, amorphous carbon black, graphite etc. However, the die-bonding adhesive layer (3a) is preferably not electroconductive from the viewpoint of preventing electric leakage.

In the dicing die-bonding film, the die-bonding adhesive layer (3a) may be protected with a separator (not shown in drawings). That is, a separator may be arbitrarily arranged. The separator functions as a protecting material protecting the die-bonding adhesive layers (3) and (3a) before use. Further, the separator can also be used as a supporting base material for transferring the die-bonding adhesive (3a) to the pressure-sensitive adhesive layer (2). The separator is removed just before a work is stuck on the die-bonding adhesive layer (3a) in the dicing die-bonding film. The separator includes a polyethylene or polypropylene film or a plastic film and paper coated with a releasing agent such as fluorine releasing agent or a long chain alkyl acrylate releasing agent.

After the separator arranged arbitrarily on the adhesive layer (3a) is removed, the dicing die-bonding film of this invention is used in the following manner. That is, a work is pressed to the die-bonding adhesive layer (3a) in the dicing die-bonding film, and the work is adhesive-bonded to the adhesive layer (3a). Further, a dicing ring is contact-bonded to the pressure-sensitive adhesive layer (2). The pressing in this invention is carried out in a usual manner. The work used in this invention is preferably a semiconductor wafer. Then, the work is diced into chips. The work includes, for example, a semiconductor wafer, a multi-layer substrate, a simultaneously sealed module etc. The work used in this invention is preferably a semiconductor wafer. By dicing, the work having the adhesive layer (3a) is formed into chipped works (semiconductor chips etc.) by suitable means using a rotating circular tooth.

Then, the chipped work together with the die-bonding adhesive layer (3a) is released from the pressure-sensitive adhesive layer (2a). The chipped work thus picked up is adhesive-bonded via the die-bonding adhesive layer (3a) to a semiconductor element as an adherend. The semiconductor element includes a lead frame, a TAB film, a substrate or a separately prepared chipped work. For example, the adherend may be a deformed adherend to be easily deformed, or a hardly deformable non-deformed adherent (semiconductor wafer etc.). The adherend is preferably a semiconductor wafer. When the adhesive layer (3a) is thermosetting, the work is adhesive-bonded to an adherend by thermosetting, to improve heat resistance. For example, the chipped work adhesive-bonded to a substrate via the adhesive layers (3a) can be subjected to a reflow process.

EXAMPLES

Hereinafter, this invention is described in more detail by reference to the Examples. In the following description, "parts" refers to parts by weight. For irradiation with ultraviolet rays, an ultraviolet (UV) irradiation unit (NEL UM-110 (Nitto Seiki Co., Ltd.) was used.

Production Example (Preparation of a Die-bonding Adhesive Layer)

The components shown in Table 1 below, that is, epoxy resin, phenol resin, acrylic rubber, silica and a curing accelerator were compounded in the ratios shown in the table to prepare compositions for die-bonding adhesives (A) to (C), and each composition was mixed with and dissolved in toluene. The mixed solution was applied onto a polyester film (separator) treated with a releasing agent. Then, the polyester film coated with the mixed solution was dried at 120° C. to remove the toluene, whereby each of the die-bonding adhesive layers A to C of 20 μm in thickness in the B-stage on the polyester film were obtained.

TABLE 1

| Compositions | Die-bonding adhesive (parts by weight) | | |
|---|---|---|---|
| | A | B | C |
| Epoxy resin (a1) | 24.9 | 24.9 | 15.5 |
| Epoxy resin (a2) | 24.9 | 24.9 | 15.5 |
| Phenol resin | 29.2 | 29.2 | 18 |
| Acrylic rubber | 20 | 20 | 50 |
| Silica | 0 | 100 | 100 |
| Curing accelerator | 1 | 1 | 1 |

In Table 1,

<Epoxy resin (a1)> is bisphenol A type epoxy resin (epoxy equivalent, 186 g/eq.; viscosity, 10 Pa·s/25° C.), <Epoxy resin (a2)> is triphenol methane type epoxy resin (epoxy equivalent, 170 g/eq.; softening point, 80° C.; viscosity, 0.08 Pa·s/150° C.), <Phenol resin> is novolak type phenol resin (hydroxyl group equivalent, 104 g/eq.; softening point, 80° C.; viscosity, 0.1 Pa·s/150° C.), <Acrylic rubber> (Mooney viscosity: 50), <Spherical silica> Average particle diameter, 1 μm; maximum particle diameter, 10 μm, and <Curing accelerator> is triphenylphosphine.

Example 1

(Preparation of a Radiation-curing Acrylic Pressure-sensitive Adhesive)

A composition consisting of 100 parts of butyl acrylate, 5 parts of acrylonitrile and 5 parts of acrylic acid was copolymerized in a toluene solvent, to give a solution containing an acrylic polymer at a concentration of 35% by weight having a weight-average molecular weight of 800,000. To 100 parts by weight (solids content) of this acrylic polymer solution were added 5 parts by weight of a polyisocyanate-based crosslinking agent (Coronate L manufactured by Nippon Polyurethane Industry Co., Ltd.). These were dissolved uniformly in toluene to prepare a solution containing an acrylic pressure-sensitive adhesive solution at a concentration of 25% by weight.

(Preparation of a Dicing Die-bonding Film)

The above acrylic pressure-sensitive adhesive solution was applied onto a polyethylene film of 60 μm in thickness as the supporting base material and dried to form a pressure-sensitive adhesive layer of 5 μm in thickness. Hereinafter, the resulting product is referred to as pressure-sensitive adhesive film A. Then, the die-bonding adhesive layer A was transferred onto the pressure-sensitive adhesive layer of the pressure-sensitive adhesive film A, to give a dicing die-bonding film. The die-bonding adhesive layer A transferred was larger by 0.5 mm in diameter than a work face (diameter 6 inches).

Example 2

A dicing die-bonding film was prepared in the same manner as in Example 1 except that the die-bonding adhesive layer B was used in place of the die-bonding adhesive layer A in Example 1. The die-bonding adhesive layer B transferred was larger by 20 mm in diameter than a work face (diameter 6 inches).

Example 3

(Preparation of a Radiation-curing Acrylic Pressure-sensitive Adhesive)

A composition consisting of 70 parts of butyl acrylate, 30 parts of ethyl acrylate and 5 parts of acrylic acid was copolymerized in a usual manner in ethyl acetate to give a solution containing an acrylic polymer at a concentration of 30% by weight having a weight-average molecular weight of 400,000. With 100 parts by weight (solids content) of this acrylic polymer solution were compounded 50 parts of dipentaerythritol monohydroxypentaacrylate as a photopolymerizable compound and 3 parts of α-hydroxycyclohexyl phenyl ketone as a photopolymerization initiator. These were dissolved uniformly in toluene to prepare a solution containing a radiation-curing acrylic pressure-sensitive adhesive solution at a concentration of 25% by weight.

(Preparation of a Dicing Die-bonding Film)

The above radiation-curing acrylic pressure-sensitive adhesive solution was applied onto a polyethylene film of 80 μm in thickness as the supporting base material and dried to form a pressure-sensitive adhesive layer of 5 μm in thickness. Hereinafter, the resulting product is referred to as pressure-sensitive adhesive film (B). Only a wafer-attaching region (circle of 6 inches in diameter) of the pressure-sensitive adhesive layer in the pressure-sensitive adhesive film (B) was irradiated with 500 mJ/cm$^2$ UV rays (total intensity of UV rays) to give a film having the pressure-sensitive adhesive layer whose wafer-attaching region had been cured by UV rays. Then, the above die-bonding adhesive layer (B) was transferred onto the pressure-sensitive adhesive layer of the pressure-sensitive adhesive film (B), to give a dicing die-bonding film. The die-bonding adhesive layer B transferred was larger by 20 mm in diameter than a work face (diameter 6 inches).

Example 4

A dicing die-bonding film was prepared in the same manner as in Example 3 except that the die-bonding adhesive layer (C) was used in place of the die-bonding adhesive (B) in Example 3.

Example 5

A dicing die-bonding film was prepared in the same manner as in Example 3 except that the die-bonding adhesive layer (A) was used in place of the die-bonding adhesive (B) in Example 3.

Comparative Example 1

A dicing die-bonding film was prepared in the same manner as in Example 1 except that the die-bonding adhesive layer A having the same size as that of a work face (diameter 6 inches) was used.

Comparative Example 2

A dicing die-bonding film was prepared in the same manner as in Example 1 except that the die-bonding adhesive layer A having the smaller diameter by 2 mm than that of a work face (diameter 6 inches) was used.

Comparative Example 3

A dicing die-bonding film was prepared in the same manner as in Example 1 except that the die-bonding adhesive film A was transferred onto the whole area of the pressure-sensitive adhesive layer in the pressure-sensitive adhesive film A.

With respect to the dicing die-bonding films obtained in the Examples and Comparative Examples, the pressure-sensitive adhesive films and the die-bonding adhesive layers used in the respective examples were measured for their adhesion as follows according to JIS Z 0237. The results are shown in Table 2.

(1) Measurement of the adhesion of the pressure-sensitive adhesive film to an SUS304 plate (#2000 polishing)

(Wafer-attaching Region)

Without irradiation with UV rays, the pressure-sensitive adhesive film A was cut into rectangular strips of 10 mm in width. The pressure-sensitive adhesive film B was irradiated in the side of the supporting base material with UV rays (500 mJ/cm$^2$) and then cut into rectangular strips of 10 mm in width. Thereafter, the pressure-sensitive adhesive film (10 mm in width) was stuck onto an SUS304 plate (#2000 polishing) at 23° C. (room temperature) and left in a room-temperature atmosphere for 30 minutes, and the adhesion of the pressure-sensitive adhesive film when peeled off at a peel angle of 90° in a thermostat chamber at 23° C. was measured (stress rate of the pressure-sensitive adhesive film, 300 mm/min.).

(Region Other than the Wafer-attaching Region)

The pressure-sensitive adhesive films A and B were cut into rectangular strips of 10 mm in width. Thereafter, the pressure-sensitive adhesive film (10 mm in width) was stuck onto an SUS304 plate (#2000 polishing) at 23° C. (room temperature) and left in a room-temperature atmosphere for 30 minutes, and the adhesion of the pressure-sensitive adhesive film when peeled off at a peel angle of 90° in a thermostat chamber at 23° C. was measured (stress rate of the pressure-sensitive adhesive film, 300 mm/min.).

The dicing die-bonding films in Examples 1 to 5 and Comparative Examples 1 to 3 were evaluated for their performance in actual dicing die-bonding of semiconductor wafers in the following manner. The results are shown in Table 2.

<Chip Scattering During Dicing>

A mirror wafer of 0.15 mm in thickness with a circuit pattern formed thereon, obtained by grinding the back of a semiconductor wafer having a diameter of 6 inches, was used. The separator was released from the dicing die-bonding film, and the mirror wafer was contact-bonded by pressing a roller at 40° C. to the exposed adhesive layer and then subjected to full-dicing into 1×1 mm square chips. Whether the chip scattering during dicing was examined. In this procedure, none of the dicing die-bonding films in the Examples and Comparative Examples caused failure such as chips scattering during dicing.

<Pollution of the Dicing Ring>

Whether the dicing ring was polluted or not after dicing was observed with the naked eye.

(Dicing Conditions)
Dicing unit: DFD-651 manufactured by Disco.
Dicing rate: 80 mm/sec.
Dicing blade: 2050HECC manufactured by Disco.
Number of revolutions: 40,000 rpm
Cut depth: 20 μm
Cut system: Full cut/mole A
Chip size: arbitrary (1×1 mm to 15×15 mm square)

(Wafer Grinding Conditions)
Grinding unit: DFG-840 manufactured by Disco.
Wafer: 6-inch diameter (grinding of the back from 0.6 mm to 0.15 μm)
Wafer-attaching unit: DR-8500II (Nitto Seiki Co., Ltd.)

(Expanding Conditions)
Dicing ring: 2-6-1 (Internal diameter 19.5 cm, manufactured by Disco)
Drawdown: 5 mm
Die bonder: CPS-100 (NEC Kikai)

TABLE 2

|  |  | Example 1 | Example 2 | Example 3 | Example 4 | Example 5 | Comparative Example 1 | Comparative Example 2 | Comparative Example 3 |
|---|---|---|---|---|---|---|---|---|---|
| Die-bonding adhesive | Type | A | B | B | C | A | A | A | A |
|  | Thickness (μm) | 20 | 20 | 20 | 20 | 20 | 20 | 20 | 20 |
| Pressure-sensitive adhesive film | Type | A | A | B | B | B | A | A | A |
|  | Thickness (μm) | 65 | 65 | 85 | 85 | 85 | 85 | 65 | 65 |
| Difference in size of adhesive layer (3a) to work |  | +0.5 | +20 | +20 | +20 | +20 | 0 | −2.0 | whole area |
| Irradiation of the wafer-attaching region with UV rays | Before attachment of wafer | absent | absent | present | present | present | absent | absent | absent |
|  | After attachment of wafer | absent | absent | absent | absent | absent | absent | absent | absent |
| Adhesion of the pressure-sensitive adhesive film to SUS304 (N/10 mm) | Wafer-attaching region | 0.15 | 0.14 | 0.09 | 0.08 | 0.065 | 0.15 | 0.15 | 0.15 |
|  | Other region than wafer-attaching region | 0.15 | 0.14 | 3.8 | 4.8 | 3.55 | 0.15 | 0.15 | 0.15 |
| Pollution of the dicing ring | Naked eye | none | none | none | none | none | none | none | present |
| Chip scattering | Dicing/1 × 1 mm square | none | none | none | none | none | present | present | none |

The dicing die-bonding films in Examples 1 to 5 and Comparative Example 3 did not show failure such as chip scattering during dicing. On the other hand, the dicing die-bonding films in Comparative Examples 1 and 2 showed chip scattering. In Examples 1 to 5 and Comparative Examples 1 and 2, pollution of the dicing ring was not recognized. In Comparative Example 3, on the other hand, the adhesive layer was contacted with the whole area of the contact region of the dicing ring, to pollute the dicing ring. As is evident from these test results, the dicing die-bonding film having a pressure-sensitive adhesive layer between a supporting base material and an adhesive layer wherein the adhesive layer has a predetermined size can prevent pollution of the dicing ring and simultaneously suppress chip scattering.

What is claimed is:

1. A method of fixing a chipped work, comprising:
providing a dicing die-bonding film comprising a radiation-curable pressure sensitive adhesive layer formed on a supporting base material and a die-bonding adhesive layer on the pressure sensitive adhesive layer, wherein the die-bonding adhesive layer is arranged as a work-attaching region on a part of the pressure-sensitive adhesive layer, wherein
the work-attaching region being attached to the whole area of a face of an undiced attached work, wherein the work face is circular, having a diameter m1 and the work-attaching region is circular having a diameter m2, wherein m2>m1, wherein 0.1 mm$\leq$(m2−m1), and wherein 1 inch$\leq$m1$\leq$12 inches,
the work-attaching region is designed so as to be held within the inner diameter of a dicing ring stuck on the pressure-sensitive adhesive layer, wherein the dicing ring is circular, having an inner diameter m3, wherein m3>m2, and wherein 5 mm$\leq$(m3−m2),
wherein the region of the pressure-sensitive adhesive layer, to which the work-attaching region is attached, has been selectively irradiated such that the adhesion of the whole area of the region corresponding to the work-attaching region differs from that of the other region of the pressure-sensitive adhesive layer, and
wherein the adhesion of said region of the pressure-sensitive adhesive layer corresponding to the work-attaching region is lower than the adhesion of said other region of the pressure-sensitive adhesive layer;
pressing a work onto the work-attaching region of the die-bonding adhesive layer in the dicing die-bonding, thereby attaching the whole area of a face of the work to the work-attaching region attached which is larger than the whole area of the work face;
pressing a dicing ring onto said other region of the pressure-sensitive adhesive layer, thereby attaching the dicing ring to the pressure-sensitive adhesive layer while fitting the work-attaching region within the inner diameter of the dicing ring;
dicing the work into chips;
releasing the chipped work together with the die-bonding adhesive layer from the pressure-sensitive adhesive layer; and
fixing the chipped work to a semiconductor element via the die-bonding adhesive layer.

2. The method of fixing the chipped work according to claim 1, wherein the ratio of adhesion of said region of the pressure-sensitive adhesive layer corresponding to the work-attaching region relative to the adhesion of said other region of the pressure-sensitive adhesive layer is 42.2-60:1.

3. The method of claim 1, wherein the pressure sensitive adhesive layer is not irradiated between said pressing a work step and said releasing step.

4. A method for producing a semiconductor device, comprising the steps of:
providing a dicing die-bonding film comprising a supporting base material, a pressure-sensitive adhesive layer and a die-bonding adhesive layer, wherein said pressure-sensitive adhesive layer is interposed between said supporting base material and said die-bonding adhesive layer, wherein a surface area of said die-bonding adhesive layer is configured to be larger than a face area of a work to be attached to said die-bonding adhesive layer
the work-attaching region being attached to the whole area of a face of an undiced attached work, wherein the work face is circular, having a diameter m1 and the work-attaching region is circular having a diameter m2, wherein m2>m1, wherein 0.1 mm$\leq$(m2−m1), and wherein 1 inch$\leq$m1$\leq$12 inches,
the work-attaching region is designed so as to be held within the inner diameter of a dicing ring stuck on the pressure-sensitive adhesive layer, wherein the dicing ring is circular, having an inner diameter m3, wherein m3>m2, and wherein 5 mm$\leq$(m3−m2),
wherein the region of the pressure-sensitive adhesive layer, to which the work-attaching region is attached, has been selectively irradiated such that the adhesion of the whole area of the region corresponding to the work-attaching region differs from that of the other region of the pressure-sensitive adhesive layer, and
wherein the adhesion of said region of the pressure-sensitive adhesive layer corresponding to the work-attaching region is lower than the adhesion of said other region of the pressure-sensitive adhesive layer;
pressing said work onto said die-bonding adhesive layer;
pressing a dicing ring onto a pressure-sensitive adhesive layer so that said die-bonding adhesive layer is held within the inner diameter of said dicing ring;
dicing said work into chips;
releasing said chipped work together with said die-bonding adhesive layer from said pressure-sensitive adhesive layer; and
fixing said chipped work to a semiconductor element via said die-bonding adhesive layer to produce a semiconductor device.

5. The method of claim 4, wherein the pressure sensitive adhesive layer is not irradiated between said pressing a work step and said releasing step.

6. The method according to claim 4, wherein the step of preparing a dicing die-bonding film comprises forming said die-bonding adhesive layer by using a thermosetting die adhesive.

7. The method according to claim 4, wherein said die-bonding adhesive layer is non-conducting.

UNITED STATES PATENT AND TRADEMARK OFFICE
CERTIFICATE OF CORRECTION

| | |
|---|---|
| PATENT NO. | : 7,780,811 B2 |
| APPLICATION NO. | : 11/671982 |
| DATED | : August 24, 2010 |
| INVENTOR(S) | : Matsumura et al. |

It is certified that error appears in the above-identified patent and that said Letters Patent is hereby corrected as shown below:

At Column 1, Line 6, After "10/849,414," insert --now US Patent 7,449,226-- therefor.

At Column 3, Line 61, please delete "Invention," and insert --invention,--, therefor.

At Column 6, Line 48 after "polymer.", please insert -- A specific means of an external crosslinking method includes a method of reacting monomers by adding a crosslinking agent such as polyisocyanate compound, epoxy compound and aziridine compound, melamine-based crosslinking agent. When the external crosslinking agent is used, the amount of the crosslinking agent used is suitably determined according to balancing with the base polymer to be crosslinked and the use of the pressure-sensitive adhesive. Generally, the external crosslinking agent is compounded in an amount of preferably 5 parts or less by weight, more preferably 0.1 to 5 parts by weight, based on 100 parts by weight of the base polymer. If necessary, the pressure-sensitive adhesive may include various kinds of conventional additives such as tackifier, antioxidants etc.--.

At Column 6, Line 49-62, please delete "A specific means of an external crosslinking method includes a method of reacting monomers by adding a crosslinking agent such as polyisocyanate compound, epoxy compound and aziridine compound, melamine-based crosslinking agent. When the external crosslinking agent is used, the amount of the crosslinking agent used is suitably determined according to balancing with the base polymer to be crosslinked and the use of the pressure-sensitive adhesive. Generally, the external crosslinking agent is compounded in an amount of preferably 5 parts or less by weight, more preferably 0.1 to 5 parts by weight, based on 100 parts by weight of the base polymer. If necessary, the pressure-sensitive adhesive may include various kinds of conventional additives such as tackifier, antioxidants etc."

At Column 8, Line 50 please delete "pheny(2-hydrxy-2-propyl)ketone," and insert --phenyl(2-hydrxy-2-propyl)ketone--, therefor.

Signed and Sealed this
Twenty-eighth Day of June, 2011

David J. Kappos
*Director of the United States Patent and Trademark Office*